(12) United States Patent
Satoh

(10) Patent No.: US 7,772,174 B2
(45) Date of Patent: Aug. 10, 2010

(54) POLYMER-STRIPPING COMPOSITION

(75) Inventor: Shinji Satoh, Yamato (JP)

(73) Assignee: SKC Haas Display Films Co., Ltd., Choongchungnamdo (KR)

( * ) Notice: Subject to any disclaimer, the term of this patent is extended or adjusted under 35 U.S.C. 154(b) by 983 days.

(21) Appl. No.: 11/503,021

(22) Filed: Aug. 11, 2006

(65) Prior Publication Data

US 2007/0037719 A1     Feb. 15, 2007

(30) Foreign Application Priority Data

Aug. 11, 2005   (JP) ............................. 2005-233780

(51) Int. Cl.
*C11D 7/50* (2006.01)
(52) U.S. Cl. ...................................... 510/176; 510/175

(58) Field of Classification Search ................. 510/175, 510/176
See application file for complete search history.

(56) References Cited

U.S. PATENT DOCUMENTS

| | | | |
|---|---|---|---|
| 6,531,436 B1 * | 3/2003 | Sahbari et al. | 510/176 |
| 2004/0229762 A1 * | 11/2004 | Rutter, Jr. | 510/175 |
| 2007/0272275 A1 * | 11/2007 | Wu et al. | 134/19 |

* cited by examiner

*Primary Examiner*—Gregory E Webb
(74) *Attorney, Agent, or Firm*—Edwin Oh

(57) ABSTRACT

Compositions useful for removing a polymer material from a substrate, such as an electronic device, and methods of using such compositions are provided. These compositions and methods reduce the corrosion of any underlying metal surfaces, and are particularly suited to remove polymer residues from electronic device substrates.

2 Claims, 2 Drawing Sheets

POLYMER-STRIPPING COMPOSITION

The present invention relates to the field of removing polymer materials from substrates. In particular, the present invention relates to a composition and method for removing residues that remain adhered to the substrates used in the production of electronic devices such as semiconductor equipment and liquid crystal display equipment and flat panel displays after the plasma etching and ashing processes.

Many materials that contain polymers are used in the production of electronic devices, including circuits, disk drives, storage media devices, and liquid crystal display equipment. Such polymer materials are found in photoresists, solder masks, antireflection coatings, and the like. The polymer materials are exposed to special processes and treatment conditions during the process of manufacturing such electronic devices, such as halogen or halide plasma etching, auto-plasma ash processing, reactive ion etching, and ion milling. These processes and treatment conditions cause extensive crosslinking of the photoresist polymers and make it very difficult to remove the crosslinked polymer materials.

For example, a positive resist material is used in the photolithography step to form a line pattern on a substrate such as a glass plate. The pattern can be formed on the substrate by etching or another method. The desired pattern is formed by stacking the resist material as a film and exposing this resist film to energetic radiation. The exposed region is subsequently subjected to a dissolution treatment using a suitable developer. After the pattern has been formed in the substrate, the resist material must be removed completely from the substrate to avoid any adverse effects or problems in subsequent processing or treatment steps.

The photoresist material in such a photolithography process must be removed uniformly and completely from all of the unexposed regions to permit further lithography processing after the pattern has been drawn. It is also undesirable for there to be any partial residues of the resist in regions in which the pattern is to be formed. Undesirable resist residues between the lines of the resulting pattern present adverse effects on subsequent treatments such as metallization, or can lead to an undesirable surface state and charge.

Plasma etching, reactive ion etching, and ion milling are needed in order to make the surface shapes even finer and to raise the pattern density. However, the photoresist film forms hard-to-remove organic metal polymer residues on the lateral surfaces of the etched structure during the plasma etching process. The photoresist is also extensively crosslinked because of the high vacuum and high temperature conditions in the etching chamber. Such polymer residues cannot be adequately removed. For example, acetone and N-methyl pyrrolidone are generally used under rigorous conditions that include high temperature and a long cycle time. Such conditions frequently surpass the flash point of the solvent and pose problems related to the environment, health, and safety. Furthermore, the long processing cycle adversely affects productivity. Manual brushing is generally required in order to remove the firmly-adhered polymer residues from the fine structures, even when such rigorous polymer removal conditions are used.

The semiconductor production industry has recently switched to a process whereby the metal and oxide layers are subjected to a dry plasma etching to form sub-half-micron structures. Copper metal has also come to be used in circuit formation. As a result, the demand has considerably increased for photoresists and polymer removers that function effectively and do not damage the circuit lines of the fine structures. Known photoresist removal and stripping compositions cannot be used to remove crosslinked polymers formed by etching treatment. Typical organic polar solvents used in conventional stripping compositions include pyrrolidones such as N-methyl pyrrolidone, N-ethyl pyrrolidone, N-hydroxyethyl pyrrolidone, and N-cyclohexyl pyrrolidone; amides that contain dimethylacetamide or dimethylformamide; phenol; and derivatives thereof. Such solvents are used in combination with amines or other alkali components that are effective in photoresist polymer removal. Conventional compositions are not effective for removing polymers after plasma etching.

Aqueous mixtures of hydroxylamine and alkanolamine have been used in conjunction with different chelating agents in recent years. For example, U.S. Pat. No. 5,334,332 discloses a composition for stripping etching residues that contains 5-50% hydroxylamine and 10-80% of at least one type of alkanolamine and water. U.S. Pat. No. 4,401,747 discloses a stripping composition that contains 30-90% 2-pyrrolidone and 10-70% dialkyl sulfone. U.S. Pat. No. 5,795,702 discloses a polymer-stripping composition that contains 2-30% hydroxylamine, 2-20% amine, 35-80% water-soluble organic solvent, and 2-20% corrosion inhibitor in water.

The above compositions can be effective in typical Al/Si wafers that contain titanium nitride (TiN) as cap and barrier layers, but cannot be used in 100% copper devices or devices with a high copper content, or dielectric materials with a low dielectric constant (low-k). These compositions will also corrode other alloys that are susceptible to corrosion, such as tungsten, gallium, and gallium arsenide. Soft metals, such as copper and tungsten, are readily corroded by optional hydroxylamine-containing materials. Copper also has a strong tendency to form complexes with hydroxylamine, and such products are undesirable to use with 100% copper or alloys with a high copper content.

Known polymer-stripping compositions that contain hydroxylamine also have many drawbacks such as flammability, risk of explosion, toxicity, volatility, odor, and instability at the processing temperature.

U.S. Pat. No. 5,988,186 discloses a polymer-stripping composition that contains at least approximately 10 wt % water, water-soluble polar solvent, organic amine, and gallic acid or gallic acid ester. This patent does not disclose any combination of polyol compound and polar organic solvent.

U.S. Pat. No. 5,561,105 discloses a photoresist polymer-stripping composition that contains an organic polar solvent with a dipole moment greater than 3.5, an amine compound selected from among compounds with a specific formula, and a chelating agent that contains a monovalent or polyvalent acid ligand covalently bonded to the polymer or oligomer backbone. This patent does not disclose any compositions that do not contain a polyol compound or acid-type ligand.

Japanese (Kokai) 2002-184743 discloses a polymer-stripping composition that contains water, a polyol compound, water-miscible amine, and polar solvent. This patent application lists water as an essential component.

A need has thus existed for a polymer-stripping composition that removes polymer materials effectively, lessens the burden on the environment, poses less risk in manufacture, and does not corrode the thin metal film and dielectric layers in the substrate.

The present inventors discovered a composition capable of easily stripping polymer materials from substrates that have copper circuits, liquid crystal display equipment, disk drives and thin film heads for storage media devices, plasma display panels ("PDP"), and other such flat panel display substrates. This polymer-stripping composition does not corrode the layers of metal such as copper, copper alloy, aluminum, tungsten, and gallium present beneath the polymer material, and is capable of removing the polymer material.

The present invention provides a composition for removing a polymer material from a substrate, wherein the composition includes one or more types of polyol compound, one or more types of glycol ether solvent, N-methyl pyrrolidone, and one or more types of corrosion inhibitor; and is substantially water-free.

The present invention also provides a non-aqueous solution composition for removing a polymer material from a substrate, wherein the composition includes one or more types of polyol compound, one or more types of glycol ether solvent, N-methyl-2-pyrrolidone, one or more types of corrosion inhibitor, optionally one or more types of nonionic surfactant, and optionally one or more types of alkanolamine compound.

Further, the present invention provides a method for removing a polymer material from a substrate including the step of bringing the composition described above into contact with a substrate containing a polymer material to be removed.

The present invention still further provides a method for manufacturing flat panel displays such as LCDs and PDPs, that includes the step of bringing the substrate containing the polymer material to be removed and metal into contact with the above-mentioned composition, which contains one or more types of polyol compound, one or more types of glycol ether solvent, and N-methyl pyrrolidone.

Figure 1:
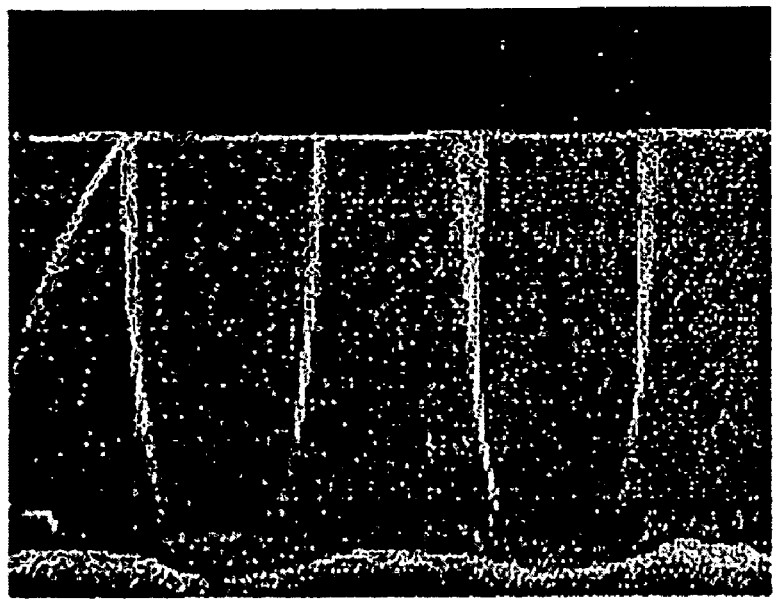
FIG. 1 is a scanning electron micrograph ("SEM") of a wafer with a via hole that contains side wall polymer.

An advantage of the composition of the present invention is its capability of effectively removing plasma-etched resist layers or residues that are difficult to remove by conventional polymer-stripping compositions. Another advantage of the composition of the present invention is its capability of removing difficult-to-remove modified resist layers or resist residues at a relatively low temperature in a short time.

The composition of the present invention provides a polymer stripping agent with improved polymer stripping power. This composition is substantially non-corrosive to metals present on the substrate, especially copper, copper alloy, aluminum, tungsten, gallium, and gallium alloy.

Another advantage of the composition of the present invention is that it is extremely effective in completely removing difficult-to-remove resist layers and residues after ashing a deep UV photoresist coated on top of an organic antireflection coating polymer layer. Such organic antireflection-coating residues, which are crosslinked polymer materials, are extremely difficult to wash away by conventional resist stripper solutions.

The composition of the present invention is very effective in removing plasma-etched polymers from silicon wafers, flat panel display substrates, and other assorted device substrates that are subjected to dry plasma etching processes.

The abbreviations used in this specification have the following denotations unless otherwise explicitly stated: G=gram; ° C.=degrees Celsius; ppm=parts per million; Å=angstrom; wt %=% by weight; min=minute; cm=centimeter; mL=milliliter; MPD=2-methyl-1,3-propanediol; DPM=dipropylene glycol monomethyl ether; BTA=benzotriazole; MIPA=monoisopropanolamine, and NMP=N-methyl-2-pyrrolidone. All percentages are weight percentages. All the numerical ranges include the border values and can be combined in arbitrary sequences, excepting cases in which such numerical ranges clearly total 100%.

The terms "polymer removal" and "removal" are used interchangeably with the same meaning throughout this specification. Similarly, the terms "polymer-stripping composition" and "stripping agent" are used interchangeably with the same meaning.

"Polymer removal" means the removal of a polymer material from a substrate and/or removal of an etched polymer residue, such as a photoresist and antireflection coating. The term "polymer-stripping composition" does not include the solution, i.e., developer, used to remove the photoresist from the parts exposed during exposure, or unexposed parts, to form the after image pattern.

The term "alkyl" means linear, branched, and cyclic alkyl.

The composition of the present invention contains one or more types of polyol compound, one or more types of glycol ether solvent, and N-methyl pyrrolidone. The term "polyol compound" means an alcohol that has two or more hydroxyl groups. Examples include ($C_2$-$C_{20}$) alkanediols, ($C_2$-$C_{20}$) alkanetriols, substituted ($C_2$-$C_{20}$) alkanediols, and substituted ($C_2$-$C_{20}$) alkanetriols. Suitable polyol compounds include, but are not limited to, ethylene glycol, diethylene glycol, triethylene glycol, polyethylene glycol, propylene glycol, dipropylene glycol, tripropylene glycol, polypropylene glycol, 1,3-propanediol, 2-methyl-1,3-propanediol, butanediol, pentanediol, hexanediol, and glycerol. The polyol compound is typically 1,3-propanediol, 2-methyl-1,3-propanediol, butanediol, or glycerol, and more typically 1,3-propanediol or 2-methyl-1,3-propanediol.

The polyol compound of the present invention is typically used in a quantity of approximately 5-40 wt % based on the total weight of the composition. The polyol compound is typically used in an amount of 5-20 wt %, and more typically 8-15 wt %. Such polyol compounds are available commercially and can be used without being further refined.

The glycol ether solvent used in the composition of the present invention is one or more chosen from glycol ethers, such as ($C_1$-$C_6$) alkyl ethers of ($C_2$-$C_{20}$) alkanediols and di($C_1$-$C_6$) alkyl ethers of ($C_2$-$C_{20}$) alkanediols. Suitable glycol ethers include, but are not limited to, ethylene glycol monomethyl ether, diethylene glycol monomethyl ether, propylene glycol monomethyl ether, propylene glycol dimethyl ether, propylene glycol mono-N-butyl ether, dipropylene glycol monomethyl ether, dipropylene glycol dimethyl ether, dipropylene glycol mono-N-butyl ether, and tripropylene glycol monomethyl ether. Dipropylene glycol monoalkyl ethers can be cited as examples of suitable glycol ethers, with dipropylene glycol monomethyl ether being more preferable.

The glycol ether solvent of the present invention is typically used in a quantity of 25-65 wt % based on the total weight of the composition. The amount is more typically 30-55 wt % of glycol ether solvent, and yet more typically approximately 30-50 wt %. Such glycol ether solvents are available commercially. Examples include those marketed under the trade name DOWANOL, such as DOWANOL DPM, DOWANOL TPM, DOWANOL PNB, and DOWANOL DPNB. These are all available from Dow Chemical Company (Midland, Mich., USA).

The N-methyl-2-pyrrolidone used in the composition of the present invention is typically used in a quantity of 25-65 wt % based on the total weight of the composition. The amount is more typically 30-55 wt % of N-methyl-2-pyrrolidone, and yet more typically 30-50 wt %. This N-methyl-2-pyrrolidone is available commercially and can be used without any further refining.

An amine compound can be optionally used in the composition of the present invention. Examples of suitable amine compounds include alkyleneamines such as ethylenediamine, diethylenetriamine, triethylenetetramine, and propylenediamine; and amino alcohols such as aminoethyl aminoethanol, ethanolamine, diethanolamine, triethanolamine, monoisopropanolamine, diisopropanolamine, and 3-amino-1-propanol. There are no particular limitations with regards to the amine compound as long as it can be dissolved in the composition of the present invention. Aminoethyl aminoethanol, 3-amino-1-propanol, monoisopropanolamine, and ethanolamine are preferred. Monoisopropanolamine can be given as an example of an especially suitable amine compound.

The amine compound is typically used in a quantity of 0-10 wt % based on the total weight of the composition. The amount of amine compound is more typically 0-8 wt %, and still more typically 0.01-5 wt %. Amine compounds are available commercially; for example, from Aldrich (Milwaukee, Wis., USA) and Dow Chemical Company (Midland, Mich., USA) and can be used without any further purification.

The composition of the present invention can additionally contain one or more of corrosion inhibitors, lubricants, surfactants, freezing inhibitors, viscosity regulators, or other components as needed. It typically contains at least one type of corrosion inhibitor and surfactant. Examples of suitable corrosion inhibitors in the present invention include, but are not limited to, catechols; $(C_1-C_6)$alkyl catechols such as methyl catechol, ethyl catechol, and tert-butyl catechol; benzotriazoles; $(C_1-C_{10})$alkyl benzotriazoles; gallic acid; and gallic acid esters such as methyl gallate and propyl gallate. Catechol, $(C_1-C_6)$alkyl catechols, benzotriazole, and $(C_1-C_{10})$alkyl benzotriazoles are preferred as corrosion inhibitors with benzotriazole being more preferred.

When present, such corrosion inhibitors are typically used in a quantity ranging from 0 to 10 wt % based on the total weight of the polymer-stripping composition. The more typical amount of corrosion inhibitor is 0.01-5 wt %, yet more typically 0.54 wt %, and most typically 0.5-2 wt %. At least one type of corrosion inhibitor is preferably used in the polymer-stripping composition of the present invention. Such corrosion inhibitors are available commercially, for example, from Aldrich Chemical Company.

A nonionic and/or anionic surfactant can be used in the polymer-stripping composition of the present invention. Nonionic surfactants such as alkyl ether compounded with poly-oxyalkylene are typically used. Such surfactants are used in a quantity of 0-10 wt % based on the total weight of the composition, typically 0.001-5 wt %, and more typically 0.005-2 wt %. Such surfactants are generally available commercially, for example, from Wako Pure Chemical Company (Japan).

A particularly suitable composition of the present invention contains 5-40 wt % of a polyol compound chosen from 1,3-propanediol, 2-methyl-1,3-propanediol, and butanediol; 25-65 wt % of a dipropylene glycol monoalkyl ether solvent; 25-65 wt % of N-methyl-2-pyrrolidone; 0-10 wt % of an amine compound chosen from aminoethyl aminoethanol, ethanolamine, diethanolamine, triethanolamine, monoisopropanolamine, diisopropanolamine, ethylenediamine, diethylenetriamine, and triethylenetetramine; 0 to 10 wt % of a nonionic surfactant; and 0.2-5 wt % of a corrosion inhibitor chosen from benzotriazole and $(C_1-C_{10})$alkyl benzotriazoles.

The composition of the present invention can be prepared by mixing one or more types of polyol compound, one or more types of glycol ether solvent, N-methyl pyrrolidone, and optional components, such as one or more types of corrosion inhibitor or surfactant, in any order.

The composition of the present invention is appropriate for removing a polymer material from a substrate. Suitable polymer materials for removal according to the present invention include photoresists, solder masks, organic antireflection coatings, and arbitrary residues produced therefrom. Typical polymer materials include photoresist residues that have been made more difficult to remove as a result of a plasma etching or similar treatment. The composition of the present invention is particularly useful in removing polymer materials and polymer residues after materials such as photoresists have been subjected to plasma etching, reactive ion etching, or ion milling. Such polymer materials and polymer residues that remain after plasma etching, reactive ion etching, and ion milling are typically organometallic polymer residues. Such organometallic residues are called "side wall polymers."

The polymer material or polymer residue on the substrate is removed by bringing the substrate into contact with the composition of the present invention. The substrate can be brought into contact with the composition of the present invention by any known means, such as by immersing the coated wafer in a bath of the polymer stripper or by placing the wafer in a spray chamber and spraying it with the polymer stripper. This is followed by rinsing, such as with deionized water, and drying.

One advantage of the present invention is that it can be used at a lower temperature than known polymer-stripping compositions. The polymer material removal process of the present invention can be carried out at any temperature, e.g., from room temperature (approximately 20° C.) to 100° C., typically 25-90° C., more typically approximately 30-80° C., and still more typically 30-70° C. The polymer to be removed is typically brought into contact with the composition of the present invention for a long enough time for the polymer residue to be at least partially removed. Although the particular time depends on the type of polymer to be removed, the polymer material and composition of the present invention are brought into contact for up to 60 minutes, and typically up to 20 minutes. A shorter time is acceptable if the substrate does not have a shape from which the polymer materials are not readily removed, such as via holes. The contact time between the substrate with the polymer material and the composition of the present invention is up to 60 minutes, typically up to 20 minutes, and more typically 40-120 seconds.

Accordingly, the present invention provides a method for manufacturing electronic devices that have a substrate containing one or more types of metal and one or more types of polymer material, with the method including of the steps of contacting the polymer material to be removed with the composition of the present invention for a sufficient time to remove the polymer material, and then rinsing the substrate.

The composition of the present invention are substantially water-free. The terms "substantially water-free" and "non-aqueous solution" mean that water is not added as a component of the composition, but does not mean that water may not be present in the component compounds. Specifically, water can be present in an amount of up to 5 wt % based on the total weight of the composition, typically 3 wt % or less, and more typically 1 wt % or less.

The composition of the present invention also does not contain hydroxylamine or acid-type chelating agents such as metal ions and ethylenediaminetetraacetic acid. The composition of the present invention also preferably does not contain tetraalkylammonium hydroxides, such as tetramethylammonium hydroxide. Furthermore, the composition of the present invention preferably does not contain alkali metal hydroxides, fluorine ion, fluorides, or amino acids. The composition of the present invention more preferably does not contain any chelating agent that contains monovalent or polyvalent acid-type ligands covalently bonded to the polymer of oligomer backbone.

The following working examples are intended to illustrate various modes of the present invention.

WORKING EXAMPLE 1

This working example shows the results of the polymer stripping capacity of the composition of the present invention.

The polymer-stripping compositions evaluated were produced in the component ratios shown in Table 1. Wired-via substrates (chips) (1.5 cm×2 cm) that did not have a titanium nitride layer were prepared by halide chemical etching using a typical dry etching process followed by an oxygen plasma ashing process. Titanium-rich polymer residues were formed on the lateral surfaces of the via holes. FIG. 1 is an SEM photo that shows the presence of the titanium-rich polymer residue on the lateral surfaces of the via hole.

Next, the chip wafer was immersed for 30 minutes in a bath of 500 mL of the polymer-stripping composition of Table 1 that had been heated to 70° C. The chip wafer was then rinsed for 60 seconds with deionized water and dried in a nitrogen stream.

Figure 2:
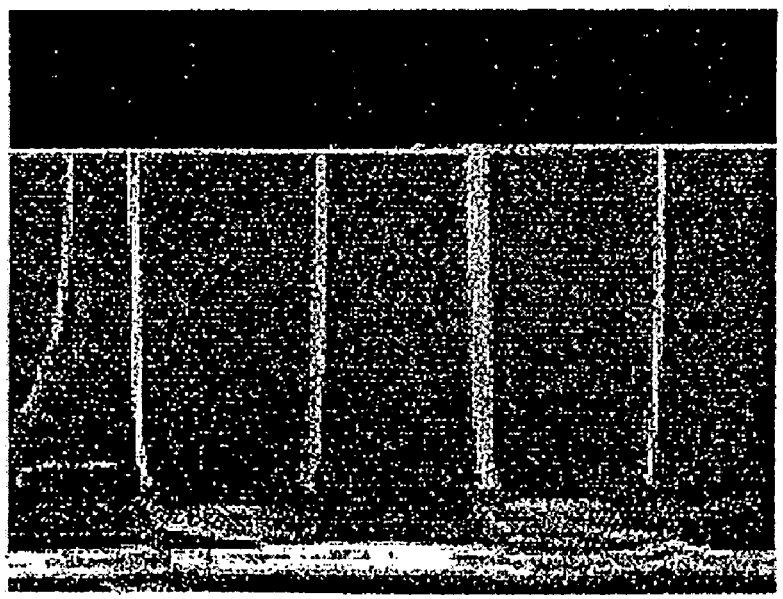
FIG. 2 is an SEM taken after removal of the side wall polymer from the wafer shown in FIG. 1 using the composition of the present invention.
Figure 3:
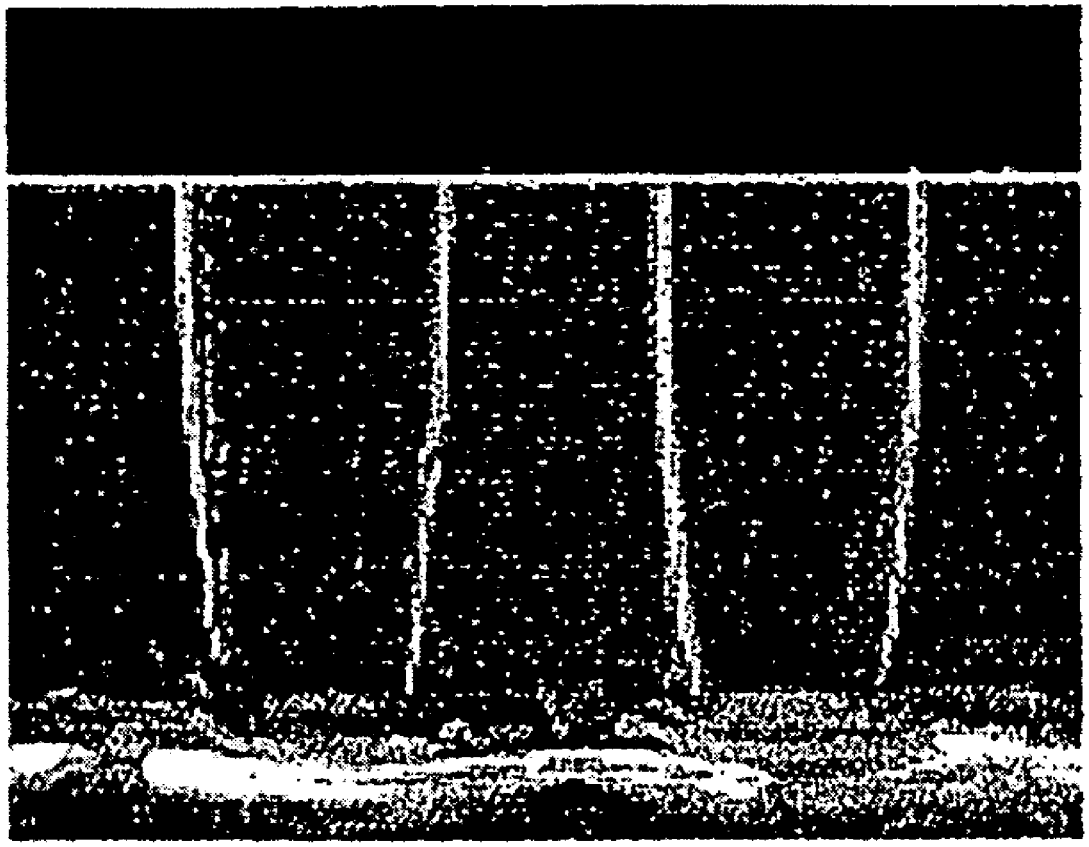
FIG. 3 is an SEM taken after treatment of the wafer shown in FIG. 1 by a conventional side wall polymer stripping agent.

The polymer residues of the chip wafer obtained in this way were evaluated by a scanning electron microscope (SEM) using a JEOL 6320 field emission-type scanning electron microscope (FE-SEM). The side wall polymer removal of multiple chip wafers was evaluated. The results of polymer removal are shown in FIGS. 2 and 3. The magnification of the SEM photos shown in FIGS. 1-3 is 30,000×.

TABLE 1

| Sample | Composition |
|---|---|
| 1 | 42% DPM/46.94% NMP/10% MPD/0.05% MIPA/1% BTA/ 0.01% surfactant |
| 2 | 24% DPM/61.79% NMP/14% MIPA/0.2% BTA/0.01 [%] surfactant |
| 3 | 100% NMP |

*A 30% aqueous solution of polyoxyalkylene alkyl ether was used as the "surfactant" in Samples 1 and 2.

FIG. 1 is an SEM photo taken prior to treatment by Samples 1 or 2. Ideally, the lateral surfaces of the via hole should be perpendicular to the via opening (in other words, all parts of the via hole should be a cylinder with the same inner diameter). However, the inner diameter of the via hole decreases downward along the via hole in FIG. 1 (in other words, the via hole becomes progressively narrower toward the bottom). This is because further downward along the via hole more titanium-rich polymer residue is present on the via hole lateral surfaces, which were originally perpendicular.

Sample 1 was prepared as a polymer-stripping composition of the present invention. FIG. 2 is an SEM photo taken after treatment by Sample 1: The shape of the via hole in FIG. 2 is a cylinder whose lateral surfaces are basically perpendicular with regard to the via opening. In other words, no visible traces of polymer residue could be found inside the via hole. This shows that the polymer-stripping composition of the present invention effectively removes polymer materials such as titanium-rich polymer residues that contain side wall polymers produced as a result of conventional plasma etching.

By contrast, Sample 2 is a conventional polymer-stripping composition. It was prepared for the sake of comparison with the composition of the present invention. FIG. 3 is an SEM photo taken after treatment by Sample 2. Sample 2 removed some of the polymer residue inside the via hole, but the extent of removal was unsatisfactory.

The above data clearly show that the compositions of the present invention effectively remove polymer materials from a substrate, especially plasma etched polymer materials and organometallic side wall polymers such as titanium-rich organometallic side wall polymers produced as a result of overetching by oxygen plasma ashing.

WORKING EXAMPLE 2

Three compositions prepared according to Table 1 were evaluated as to their compatibility with various metal substrates. Wafers that contained one or more aluminum and copper layers were immersed for one minute at 40° C. in polymer stripper solutions prepared according to the compositions shown in Table 1. They were then rinsed for one minute with deionized water, and the metal loss on the wafer was evaluated. The amount of metal lost from the respective surfaces was measured using a four-point probe. The results are shown in Table 2 in the etching rates.

TABLE 2

| Sample | Aluminum | Copper |
|---|---|---|
| 1 | 0.2 Å/min | 1.0 Å/min |
| 2 | 4.0 Å/min | 10.0 Å/min |
| 3 | 4.5 Å/min | 12.0 Å/min |

These data clearly show that the compositions of the present invention do not significantly corrode aluminum and copper which are highly susceptible metals.

WORKING EXAMPLE 3

Sample 1 of Working Example 1 was used to remove the polymer material from a wafer that contained an indium tin oxide/tantalum (ITO/Ta) layer on a flat panel display glass substrate. No visible corrosion of any metal layer was evident.

These data show that the compositions of the present invention are especially effective in removing difficult-to-remove side wall polymers such as highly oxidized, overetched polymer materials. These data also demonstrate that the compositions of the present invention are less corrosive to undercoating metals, especially copper, than conventional polymer-stripping compositions.

What is claimed is:

1. A non-aqueous solution composition for removing a polymer material from a substrate, wherein the composition includes approximately 30 to 40 wt % of a polyol compound selected from among 1,3-propanediol, 2-methyl-1,3-propanediol, butanediol, and glycerol; approximately 25 to 65 wt % of a glycol ether solvent selected from among ethylene glycol monomethyl ether, diethylene glycol monomethyl ether, propylene glycol monomethyl ether, propylene glycol dimethyl ether, propylene glycol mono-N-butyl ether, dipropylene glycol monomethyl ether, dipropylene glycol dimethyl ether, and dipropylene glycol mono-N-butyl ether; approximately 25 to 65 wt % of N-methyl-2-pyrrolidone; approximately 0 to 10 wt % of one or more types of amine compound selected from the group composed of ethylenediamine, diethylenetriamine, triethylenetetramine, propylenediamine, aminoethyl aminoethanol, ethanolamine, diethanolamine, triethanolamine, monoisopropanolamine, diisopropanolamine, and 3-amino-1-propanol; approximately 0 to 10 wt % of a nonionic surfactant; and approximately 0.2 to 5 wt % of a corrosion inhibitor selected from among catechols, ($C_1$-$C_6$) alkyl catechols, benzotriazoles, and ($C_1$-$C_{10}$) alkyl benzotriazoles; and is substantially water-free.

2. The composition of claim 1 wherein the composition contains no hydroxylamine or tetraalkylammonium hydroxide.

* * * * *